(12) United States Patent  (10) Patent No.: US 11,901,458 B2
Beattie et al.  (45) Date of Patent: Feb. 13, 2024

(54) DIELECTRIC ISOLATION LAYER BETWEEN A NANOWIRE TRANSISTOR AND A SUBSTRATE

(71) Applicant: Intel Corporation, Santa Clara, CA (US)

(72) Inventors: Bruce E. Beattie, Portland, OR (US); Leonard Guler, Hillsboro, OR (US); Biswajeet Guha, Hillsboro, OR (US); Jun Sung Kang, Portland, OR (US); William Hsu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/850,799

(22) Filed: Jun. 27, 2022

(65) Prior Publication Data

US 2022/0336668 A1    Oct. 20, 2022

Related U.S. Application Data

(63) Continuation of application No. 16/015,404, filed on Jun. 22, 2018, now Pat. No. 11,404,578.

(51) Int. Cl.
*H01L 29/78* (2006.01)
*H01L 21/8234* (2006.01)
(Continued)

(52) U.S. Cl.
CPC .. *H01L 29/7856* (2013.01); *H01L 21/823418* (2013.01); *H01L 21/823431* (2013.01);
(Continued)

(58) Field of Classification Search
CPC ............. H01L 29/7856; H01L 29/0649; H01L 29/0673; H01L 29/0847; H01L 29/42356;
(Continued)

(56) References Cited

U.S. PATENT DOCUMENTS 6,674,138 B1   1/2004 Halliyal
10,586,853 B2  3/2020 Leobandung
(Continued)

FOREIGN PATENT DOCUMENTS

WO   WO 2013095651   6/2013
WO   WO 2016105426   6/2016

OTHER PUBLICATIONS

Extended European Search Report for European Patent Application No. 19175268.2 dated Nov. 20, 2019. 9 pages.
(Continued)

*Primary Examiner* — Tu-Tu V Ho
(74) *Attorney, Agent, or Firm* — Schwabe, Williamson & Wyatt, P.C.

(57) ABSTRACT

Gate all around semiconductor devices, such as nanowire or nanoribbon devices, are described that include a low dielectric constant ("low-k") material disposed between a first nanowire closest to the substrate and the substrate. This configuration enables gate control over all surfaces of the nanowires in a channel region of a semiconductor device via the high-k dielectric material, while also preventing leakage current from the first nanowire into the substrate.

22 Claims, 9 Drawing Sheets

(51) Int. Cl.
  *H01L 27/088* (2006.01)
  *H01L 29/06* (2006.01)
  *H01L 29/08* (2006.01)
  *H01L 29/423* (2006.01)
  *H01L 29/66* (2006.01)

(52) U.S. Cl.
  CPC .. *H01L 21/823468* (2013.01); *H01L 27/0886* (2013.01); *H01L 29/0649* (2013.01); *H01L 29/0673* (2013.01); *H01L 29/0847* (2013.01); *H01L 29/42356* (2013.01); *H01L 29/6681* (2013.01); *H01L 29/66545* (2013.01); *H01L 2029/7858* (2013.01)

(58) Field of Classification Search
  CPC ........... H01L 29/66545; H01L 29/6681; H01L 21/823418; H01L 21/823431; H01L 21/823468; H01L 27/0886; H01L 2029/7858

USPC ....................................................... 257/401
  See application file for complete search history.

(56) References Cited

U.S. PATENT DOCUMENTS

| | | |
|---|---|---|
| 10,658,483 B2 | 5/2020 | Leobandung |
| 10,658,484 B2 | 5/2020 | Leobandung |
| 2015/0270340 A1 | 9/2015 | Frank et al. |
| 2017/0012124 A1* | 1/2017 | Glass ................... H01L 29/775 |
| 2017/0222045 A1 | 8/2017 | Leobandung |
| 2017/0358457 A1 | 12/2017 | Jang et al. |
| 2019/0165118 A1 | 5/2019 | Leobandung |

OTHER PUBLICATIONS

Office Action for European Patent Application No. 19175268.2 dated Sep. 24, 1921, 7 pages.

* cited by examiner

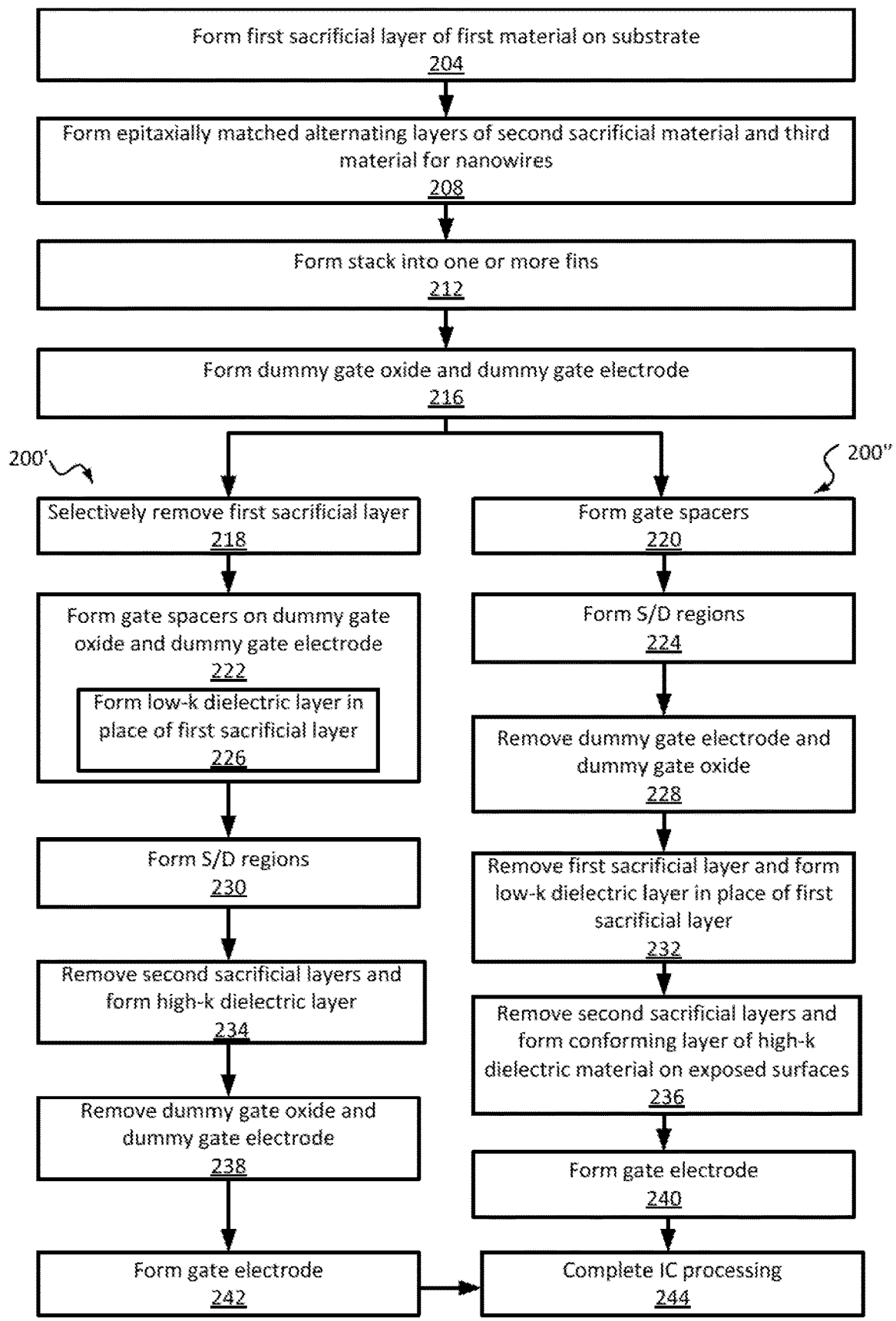

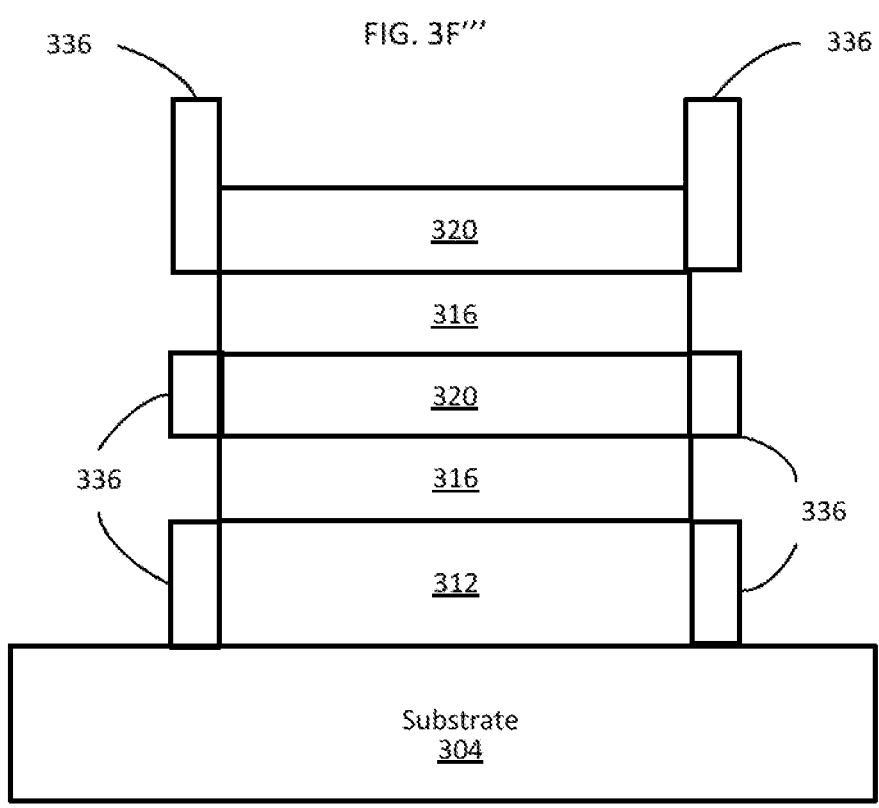

DIELECTRIC ISOLATION LAYER BETWEEN A NANOWIRE TRANSISTOR AND A SUBSTRATE

CROSS-REFERENCE TO RELATED APPLICATIONS

This application is a continuation of U.S. patent application Ser. No. 16/015,404, filed on Jun. 22, 2018, the entire contents of which is hereby incorporated by reference herein.

BACKGROUND

Semiconductor devices are electronic components that exploit the electronic properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Standard dopants used for Si, Ge, and SiGe include boron (B) for p-type (acceptor) dopant and phosphorous (P) or arsenic (As) for n-type (donor) dopant. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface).

One variation of a FinFET is a gate-all-around (GAA) transistor in which the fin is divided into one or more strips. GAA transistors may also be referred to as "nanowire" or "nanoribbon" transistors. For GAA transistors, current runs along/within all four sidewalls of the nanowire, which can then be controlled by an encapsulating gate stack.

BRIEF DESCRIPTION OF THE DRAWINGS

FIG. 2 is a method flow diagram of an example method for fabricating integrated circuit (IC) structures that includes a low dielectric constant (low-k) material between a substrate and a first GAA body closest to the substrate, in accordance with some embodiments of the present disclosure.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Example embodiments described herein include gate all around ("GAA") semiconductor devices (equivalently referred to herein as nanowire or nanoribbon devices for convenience), that include a low dielectric constant ("low-k") material between a first GAA semiconductor body (e.g., a nanowire that includes a channel region) closest to the substrate and the substrate itself. In some embodiments, the low-k material is disposed between the underlying substrate and a high-k dielectric material that is formed around at least a portion of the first GAA semiconductor body. This configuration, and other similar configurations, enables gate control over all surfaces of the GAA bodies (e.g., nanowires) in a channel region of a semiconductor device while also preventing electrical current from leaking from the first nanowire into the substrate.

General Overview

Gate all around semiconductor devices can have improved performance over planar or FinFET transistor devices in some examples. This improved performance can be due to a gate structure that is conformally disposed around a GAA semiconductor body, which includes a channel region of a semiconductor device. The gate structure includes, in some examples, a high dielectric constant ("high-k") material that is conformally disposed on the GAA body between the body and a surrounding gate electrode material. The gate structure can restrict current flow through GAA bodies by applying a bias to the sides of a given semiconductor GAA body. This can control current flow through the device. In some cases, this increased effectiveness is embodied in a lower off state leakage current and/or an increased switching speed relative to other configurations of channel regions (e.g., FinFET configurations).

Figure 1A:
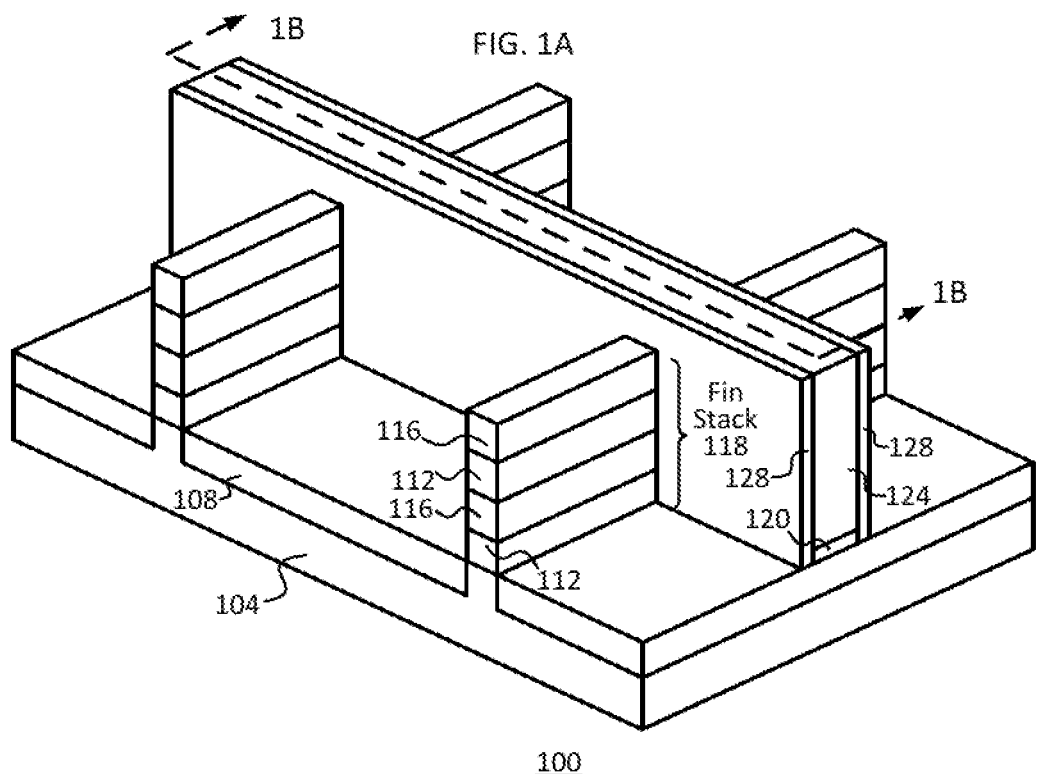
FIG. 1A is a perspective view of an example nanowire semiconductor device.
Figure 1B:
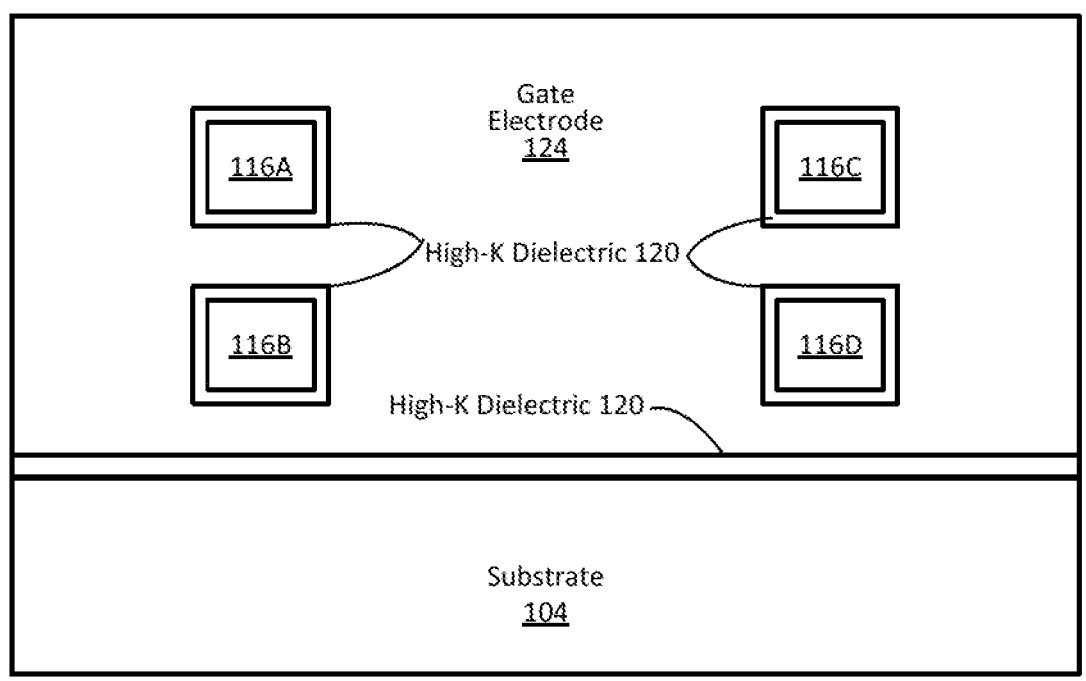
FIG. 1B is a cross-sectional view of a gate region of the nanowire semiconductor device shown in FIG. 1A taken in the direction indicated in FIG. 1A that has been further processed to remove sacrificial regions and include a high dielectric constant material conformally disposed on nanowires surfaces in a gate region between the nanowires and surrounding gate electrode material.

However, in some examples a GAA body closest to the underlying substrate retains some electronic functionality with the substrate. Turning for reference to FIGS. 1A and 1B, a perspective view and a cross-sectional view of some portions of a GAA (referred to for convenience as a "nanowire") transistor device 100 are illustrated. It will be appreciated that the nanowire transistor device 100 is one type of GAA device, selected merely for convenience of illustration.

FIG. 1A illustrates a nanowire transistor device 100 that includes a substrate 104, shallow trench isolation (STI) layer 108, sacrificial layers 112, nanowire layers 116, and a gate structure that includes a high-k dielectric layer 120, gate electrode 124, and spacers 128. The sacrificial layers 112 and nanowire layers 116 are, collectively, referred to as a fin stack 118.

The first sacrificial layer 112 is epitaxially grown from the underlying substrate 104 and provides a surface on which, in this example, alternating nanowire layers 116 and subsequent sacrificial layers 112 are epitaxially formed.

In some examples, the layers 112, 116 can be formed initially in blanket layers, which are later formed into the fin stacks 118 shown in FIG. 1A. In other examples, the layers 112, 116 can be formed using trench-based replacement fin techniques. Example trench-based replacement fin forming techniques are provided, for instance, in U.S. Pat. No. 9,728,464. In some such cases, the replacement fin material is provided as alternating layers of desired channel material and sacrificial/inactive material such as described in U.S. Pat. No. 9,812,524. Such multilayer fins are particularly useful for forming nanowire transistors (e.g., where the sacrificial (or "inactive") material is removed during final gate processing, prior to deposition of final gate materials, so as to liberate or ribbonize the channel material). Any number of fin forming processes can be used in the context of the present disclosure, as will be appreciated.

The material used to form the sacrificial layers 112 can be selectively etched, leaving the non-sacrificial layers 116 to form the nanowires 116. It will be appreciated that the sacrificial material 112 and the nanowire material 116 are selected in coordination so that an etch can remove the material of the sacrificial layer 112, but not remove the material of the nanowire layer 116.

As shown in FIG. 1B (a cross-sectional view taken in the direction indicated in FIG. 1A after removal of the sacrificial layers 112), a high-k dielectric material 120 can be conformally deposited on the exposed surfaces within a gate region (i.e., between spacers 128 shown in FIG. 1A) after removal of the sacrificial material 112. Specifically the high-k dielectric material 120 can be formed on the exposed surfaces of the nanowires 116 and on an exposed portion of the substrate 104. In some examples, the high-k dielectric material 120 has a dielectric constant that is greater than the dielectric constant k of silicon dioxide. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The high-k dielectric material layer 120 can increase gate capacitance (relative to a low-k material, such as silicon dioxide) which improves the ability of the gate electrode 124 to control current flow through nanometer sized nanowires by applying a bias to all sides of the encapsulated nanowires 116.

The use the high-k material as part of the gate stack does present some challenges, however. In particular, the "bottom" nanowires 116B and 116D of FIG. 1B that are adjacent to the underlying substrate 104 are susceptible to electrical communication with the proximately disposed semiconductor substrate 104. That is, the increased capacitance of the high-k material between the nanowires closest to the substrate can increase leakage current flow from these "bottom" nanowires through the gate electrode 124 into the substrate 104. In some examples, this layer of dielectric material between the "bottom" nanowire and the substrate includes conductive materials (e.g., those used to form the gate electrode 124), which increase the conductivity and thus leakage current from the bottom nanowire into the substrate. In some extreme cases, the bottom nanowires act as "parasitic" transistors that are difficult to control and leak current into the substrate.

Increasing the electrical isolation between the substrate and the bottom nanowires to prevent the leakage current described above can be challenging. A layer of silicon dioxide, silicon nitride, or some other low-k material that could electrically insulate the nanowires 116B, 116D from the substrate 104 cannot generally be placed on the substrate prior to formation of the various sacrificial layers 112 and nanowires 116. This is because the sacrificial layers 112 and nanowires 116 are single crystals that are epitaxially grown from the substrate 104 (i.e., they have a coherent atomic interface with the substrate crystal structure and a lattice parameter difference of less than 2%). A layer of a low-k dielectric material capable of electrically insulating the nanowires 116B, 116D from the substrate 104 that is either amorphous or not epitaxially matched with the sacrificial layers 112 and/or nanowires 116 will inhibit epitaxial, single crystal growth of the layers 112, 116. Similarly, a low-k dielectric material cannot simply be used to replace the bottom most sacrificial layers 112 (e.g., 112B and 112D), even though this would provide electrical insulation between the nanowires 116B, 116D and the substrate 104. This is because techniques used to selectively etch the sacrificial layers 112 will remove all of the sacrificial layers 112 that are exposed to the etch concurrently. This means that replacement of the bottom most sacrificial layers 112 with a material that can prevent the leakage current will also replace the other sacrificial layers 112 as well. Wholesale replacement of all sacrificial layers 112 can prevent high-k material 120 and gate electrode 124 from surrounding the nanowires 116 on all sides, which can in turn reduce GAA control of current flow through the channel regions of GAA semiconductor bodies.

Thus, in accordance with an embodiment of the present disclosure, techniques are described for forming a first sacrificial layer of a first material on a semiconductor substrate, where the first sacrificial layer is between the substrate and a bottom nanowire (whether in a source/drain region and/or within a channel region between the source and drain regions). Other sacrificial layers that are not in contact with the substrate are formed from a second material that is compositionally distinct (i.e., having a different chemical composition such as different constituent elements (e.g., SiGe vs. Si or SiO2 vs. SiOxNy) or the same constituent elements in different ratios (e.g., Si2N2O vs. SiN3O)) from the first sacrificial layer. The first material of the first sacrificial layer is composed to be epitaxial with the substrate and epitaxial with a non-sacrificial layer (used to form a GAA semiconductor body) in contact with the first sacrificial layer on a side of the first sacrificial layer opposite that of the substrate. The first material is also composed so that it can be removed at a faster rate than the other sacrificial layers formed from the second material. In this way, the alternating layers of the fin stack can be grown as single crystals that are epitaxially matched with an adjacent layer and/or the substrate in a way that also facilitates selective removal of the first ("bottom") sacrificial layer and subsequent replacement of the first sacrificial layer with a first dielectric material with a low dielectric constant. This first dielectric material electrically insulates the "bottom" nanowire from the substrate. The other sacrificial layers can be removed after replacement of the first sacrificial layer so that a second dielectric material with a high-k can be formed around the GAA semiconductor bodies prior to gate electrode formation.

Methodology and Architecture

It will be appreciated that some embodiments of the present disclosure can be applicable to configurations in which a first (or "bottom") nanowire of a GAA transistor device (i.e., closest to a substrate in the fin stack) is electrically isolated from an underlying substrate using a low dielectric constant material. Devices having such a configuration can include semiconductor-on-insulator ("SOI" or "XOI") and nanowire devices. For convenience of illustration and explanation, a fabrication methodology and architecture example comprising a nanowire device is presented below. It will be appreciated that the term "nanowire" is used for convenience and brevity, and that the use of the term "nanowire" herein will understood to encompass all GAA configures including, but not limited to nanoribbons, nanosheets, among others. It will also be appreciated that is example is not intended to limit the embodiments encompassed herein, but is merely provided to illustrate one example of a semiconductor device having a semiconductor body isolated from an underlying substrate.

FIG. 2 illustrates an example method 200 for forming GAA semiconductor devices in which a first GAA nanowire (or nanoribbon, or other analogous GAA structure) is electrically insulated from an underlying substrate by a low dielectric constant ("low-k") material. FIGS. 3A-3H show perspective views and cross-sectional views of various stages of processing according to the method 200. Concurrent reference to FIGS. 2 and FIGS. 3A-3H will facilitation explanation.

The structures of FIGS. 3A-3H are illustrated in the context of forming nanowire transistors that include two nanowires, for ease of illustration. However, the techniques may be used to form nanowire transistors that include any number of nanowires, such as 1-10, or more, in accordance with some embodiments. As will be apparent in light of this disclosure, in some embodiments, the method 200 includes forming a multilayer fin structure of alternating layers of sacrificial and non-sacrificial material, where the one or more non-sacrificial material layers are intended to be formed into nanowires by removing the intervening sacrificial material layers via selective etch processing, in accordance with some embodiments. In some embodiments, the nanowires may only be present in the channel region of the final transistor device, while in other embodiments, some or all of the nanowire layers may also be present in one or both of the source/drain (S/D) regions, as will be apparent in light of this disclosure. Various example transistor types that can benefit from the techniques described herein include, but are not limited to, field-effect transistors (FETs), metal-oxide-semiconductor FETs (MOSFETs), and tunnel-FETs (TFETs). In addition, the techniques can be used to benefit p-type devices (e.g., PMOS) and/or n-type devices (e.g., NMOS). Further, the techniques may be used to benefit various transistor-based devices, such as quantum devices (few to single electron) or complementary MOS (CMOS) devices/circuits, where either or both of the included p-type and n-type transistors may be formed using the techniques described herein, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Figure 3A:
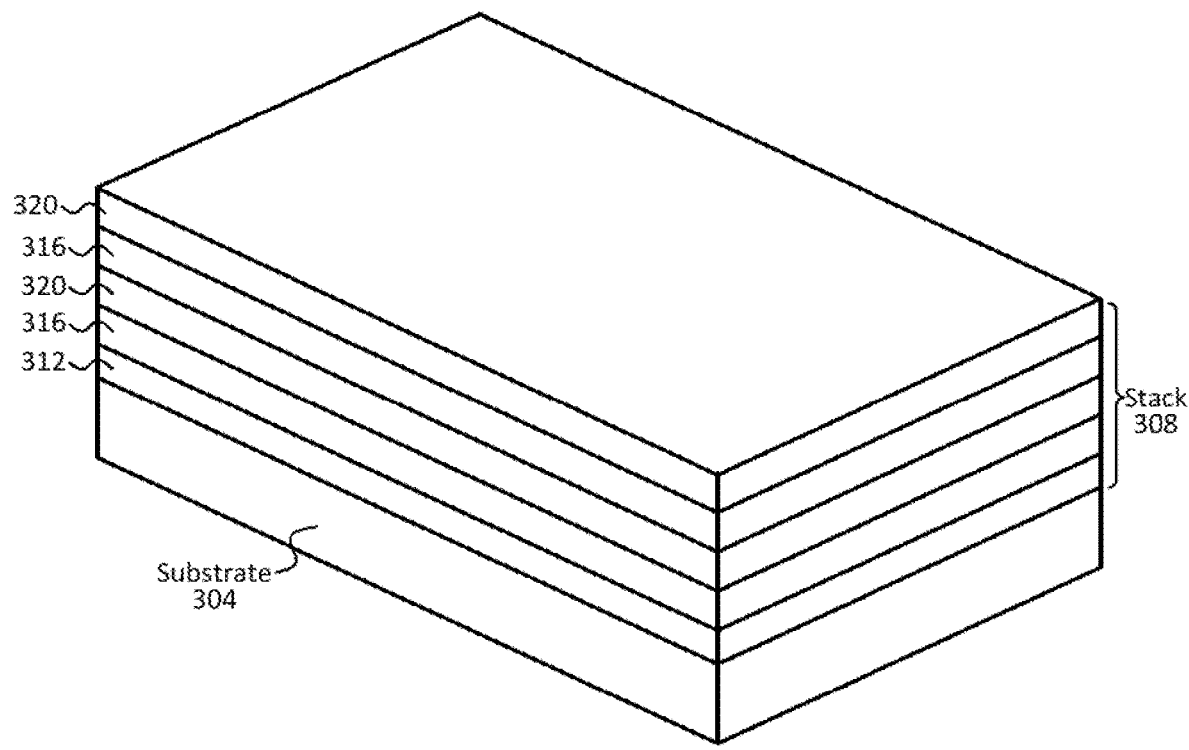
FIGS. 3A-3H illustrate example integrated circuit (IC) structures resulting from the example method illustrated in FIG. 2, in accordance with some embodiments of the present disclosure.

The method 200 begins by forming 204 a first sacrificial layer 312 of a first sacrificial material on a substrate 304. An epitaxially matched second sacrificial layer 316 of a second sacrificial material is formed on the first sacrificial layer. Alternating, epitaxially matched layers of a third non-sacrificial layer 320 and second sacrificial layer 316 are formed 208 on or over the first sacrificial layer 312. This forms a stack of layers 308. This configuration is illustrated in FIG. 3A.

In some embodiments, substrate 304 may include: a bulk substrate including group IV semiconductor material, such as silicon (Si), germanium (Ge), or silicon germanium (SiGe), and/or any other suitable semiconductor material(s); an X on insulator (XOI) structure where X includes group IV material (and/or other suitable semiconductor material) and the insulator material is an oxide material or dielectric material or some other electrically insulating material; or some other suitable multilayer structure where the top layer includes group IV material and/or other suitable semiconductor material. Recall that the use of "group IV semiconductor material" (or "group IV material" or generally, "IV") herein includes at least one group IV element (e.g., silicon, germanium, carbon, tin, lead), such as Si, Ge, SiGe, and so forth. Note that group IV may also be known as the carbon group or IUPAC group 14, for example. In some embodiments, substrate 304 may include a surface crystalline orientation described by a Miller Index plane of (001), (011), or (111), for example, as will be apparent in light of this disclosure. Although substrate 304, in this example embodiment, is shown as having a thickness (dimension in the Z-axis direction) similar to layers 312, 316 and 320 for ease of illustration, in some instances, substrate 304 may be much thicker than the other layers, such as having a thickness in the range of 50 to 950 microns, for example, which may be at least 100 times thicker than layers 312, 316 and 320, or any other suitable thickness as will be apparent in light of this disclosure. However, in embodiments where substrate 304 is just the top layer of a multilayer substrate structure (and thus, substrate 304 is essentially a pseudo-substrate), that top layer need not be so thick and may be relatively thinner, such as having a thickness in the range of 20 nm to 10 microns, for example. In some cases, the original thickness of substrate 304 may be reduced as a result of processing in, on and/or above the substrate 304. In some embodiments, substrate 304 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, and/or any other suitable semiconductor or IC devices, depending on the end use or target application. Accordingly, in some embodiments, the transistor structures described herein may be included in a system-on-chip (SoC) application, as will be apparent in light of this disclosure.

For examples of the substrate 304 that are an XOI configuration, the insulation can be fabricated from any of a number of insulator materials or semi-insulator materials used for electrical insulation in an interconnect layer of an integrated circuit. These insulator materials include, for instance, nitrides (e.g., Si3N4), oxides (e.g., SiO2, Al2O3, AlSiOx), oxynitrides (e.g., SiOxNy), carbides (e.g., SiC), oxycarbides, polymers, silanes, siloxanes, or other suitable insulator materials. In some embodiments, the substrate 304 is implemented with ultra-low-k insulator materials, low-k dielectric materials, or high-k dielectric materials depending on the application. Example low-k and ultra-low-k dielectric materials include porous silicon dioxide, carbon doped oxide (CDO), organic polymers such as perfluorocyclobutane or polytetrafluoroethylene, fluorosilicate glass (FSG), and organosilicates such as silsesquioxane, siloxane, or organosilicate glass. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In some examples, these insulating substrate materials can be generically referred to as inter layer dielectric (ILD) because they may be used as an electrically insulating material within an interconnect layer of an integrated circuit. The ILD thus prevents or reduces the occurrence of electrical shorting and/or electomigration of interconnect materials between metal features that connect successively larger numbers of transistors together.

Techniques for forming an insulator on and/or in the substrate 304 can be any of a wide range of suitable deposition techniques, including but not necessarily limited to: physical vapor deposition (PVD); chemical vapor deposition (CVD); spin coating/spin-on deposition (SOD); and/or a combination of any of the aforementioned. Other suitable configurations, materials, deposition techniques, and/or thicknesses for the substrate 304 will depend on a given application and will be apparent in light of this disclosure. The substrate 304 can be planarized in some examples so that subsequent deposition and/or patterning (e.g., photolithography and etch) processes can operate on a surface that is more uniform and flatter than the as-deposited surface. Planarization and/or polishing techniques include chemical-mechanical planarization (CMP) processes or other appropriate polishing/planarization processes as desired.

In some embodiments, the layer of first material 312 and alternating layers 316 and 320 in multilayer stack 308 may be formed using any suitable techniques, such as depositing/growing the layers, one at a time, using molecular-beam epitaxy (MBE), chemical vapor deposition (CVD), atomic layer deposition (ALD), physical vapor deposition (PVD), and/or any other suitable process as will be apparent in light of this disclosure. Recall that multilayer stack 308 is intended to be later formed into nanowires for use in the channel region of one or more transistors (and optionally into source/drain regions), in this example embodiment. Further, in this example embodiment, layers 312 and 316 are intended to be sacrificial and the layers 320 are intended to be non-sacrificial. These non-sacrificial layers 320 are intended to be formed into the nanowires (or other GAA configuration), as will be apparent in light of this disclosure. Therefore, as shown in FIG. 3A, the bottom-most layer of stack 308 is the sacrificial layer 312 of the first material and the top-most layer is non-sacrificial layer 320. However, the present disclosure is not intended to be so limited. For instance, stack 308 may alternatively have a first-formed/bottom-most layer of first sacrificial material 312 and/or a last-formed/top-most layer of second sacrificial material 316, in accordance with some embodiments. In an embodiment employing the last-formed/top-most layer as sacrificial material 316, that sacrificial layer 316 may be formed to protect the top-most non-sacrificial layer 320 in the stack prior to selective etch processing used to form the nanowire(s) in the channel region, for example. In some embodiments, the stack 308 may include more than three material layers, such as at least four different material layers, in any desired configuration to achieve a nanowire configuration for use in the channel region of a transistor, as can be understood based on this disclosure. In some such embodiments, the use of at least three different material layers may allow for different spacing between the final nanowires (e.g., via multiple selective etch processes) and/or allow for final nanowires of varying materials in the channel region, for example. As can be understood based on this disclosure, the desired number of nanowires may dictate the number of alternating sense of sacrificial layers 312, 316 and non-sacrificial layer 320 initially formed.

In some embodiments, sacrificial layers 312, 316 and non-sacrificial layers 320 may have any suitable thicknesses (dimension in the Z-axis direction), such as thicknesses in the range of 1-100 nm (e.g., 2-10 nm), or any other suitable thickness as will be apparent in light of this disclosure. As can be understood based on this disclosure, the thicknesses of layers 312, 316 and 320 will largely determine the final thicknesses of the one or more nanowires formed in the channel region of a transistor and the spaces therebetween (as well as that between the bottom-most nanowire and the substrate 304). Although layers 312, 316 and 320 are all shown in the example embodiment of FIG. 3A as having the same thicknesses, the present disclosure is not intended to be so limited. For instance, in some embodiments, sacrificial layers 312, 316 may all include similar thicknesses (e.g., +/− 1, 2, or 3 nm from their average thickness) and non-sacrificial layers 320 may all include similar thicknesses (e.g., +/− 1, 2, or 3 nm from their average thickness). In some examples, sacrificial layers 312, 316 and non-sacrificial layers 320 may include different relative thicknesses, such that sacrificial layers 312, 316 are thicker or thinner relative to non-sacrificial layers 320 (e.g., relatively at least 1, 2, 3, 4, 5, 6, 7, 8, 9, or 10 nm thicker or thinner, or some other suitable minimum threshold relative difference).

In some such embodiments, the thickness difference between the sacrificial layers 312, 316 and non-sacrificial layers 320 may be employed to achieve a desired end configuration, including desired nanowire thicknesses and desired spacing distance between nanowires, for example. In some embodiments, sacrificial layers 312, 316 and/or non-sacrificial layers 320 may include varying thicknesses, such that all sacrificial layers 312, 316 need not include relatively similar thicknesses (e.g., two sacrificial layers 312, 316 may have relative thickness differences of greater than 1, 2, 3, 4, or 5 nm) and/or all non-sacrificial layers 320 need not include relatively similar thicknesses (e.g., two non-sacrificial layers 320 may have relative thickness differences of greater than 1, 2, 3, 4, or 5 nm). For instance, in some such embodiments, the bottom-most sacrificial layer 312 may be relatively thicker than other sacrificial layers 316 in stack 308 to provide increased electrical insulation between the bottom-most nanowire 320 formed and substrate 304 after the sacrificial material is removed, for example.

In some embodiments, sacrificial layers 312, 316 may include any suitable material that enables the sacrificial layer 312 to be removed before the sacrificial layer 316 is removed, such as group IV semiconductor materials, for example. For instance, in some embodiments, sacrificial layers 312, 316 may include at least one of Si and Ge where the Ge content of the first material of the first sacrificial layer 312 is higher than the Ge content of the second sacrificial material of the second sacrificial layer 316. This difference in composition can increase etch rate of the first sacrificial layer 312 relative to that of the second sacrificial layer 316. For example, a Ge content that is at least 5 atomic (at.) %, at least 7 at. %, at least 10 at. %, at least 15 at. %, or at least 20 at. % greater in the first sacrificial layer 312 than the Ge content found in the second sacrificial layer 316 can be sufficient to increase the etch rate of the first sacrificial layer 312 compared to the second sacrificial layer 316. In embodiments where SiGe material is included in one or more sacrificial layers of stack 308, any Ge concentration may be used in the SiGe compound, such that the SiGe may be represented as Si1-xGex where 0<x<1, for instance, provided that the different in composition described above is present between the first sacrificial layer 312 and the second sacrificial layer 316. For SiGe based sacrificial layers, one or both of C1F and F2 etchants can be used.

In some examples, the selective etch processing (whether used for the first sacrificial layer 312 or the second sacrificial layers 316) described above may include one or more selective etches that remove the material of the first sacrificial layer 312 at a rate of at least 1.5, 2, 3, 4, 5, 10, 50, 100, or 1000 times faster relative than the removal of the second sacrificial layer 316 and similarly faster than the removal of the material of non-sacrificial layers 320 for a given etchant. In some embodiments, the selective etch processing may not remove any material (or remove a negligible amount of material) from the non-sacrificial layers 320, for example. As can be understood based on this disclosure, the particular etchants used in the selective etch process may be selected based on the materials included in sacrificial layers 312, 316 and non-sacrificial layers 320, for example.

In some embodiments, one or more of the layers included in the multilayer stack 308 may include impurity dopants using any suitable doping scheme, such as doping one or more of the layers using suitable n-type dopants and/or doping one or more of the layers using suitable p-type dopants, for example. In some such embodiments, impurity dopants may be introduced via diffusion and/or ion implantation, for example, and/or via any other suitable techniques. However, in some embodiments, the layers in stack 308 need not include doping (e.g., neither of n-type or p-type dopants), such that the material in the layers are intrinsic or end up being only nominally undoped (e.g., with dopant concentrations of less than 1E18 atoms per cubic centimeter or some other maximum threshold dopant concentration). In some such embodiments, it may be desired that the layers in stack 308 (which includes layers to be in the final channel region of the transistor device) be intrinsic for use in a TFET device, as TFET devices generally include a source-channel-drain doping scheme of p-i-n or n-i-p, where 'p' stands for p-type doped material, 'n' stands for n-type material, and 'i' stands for intrinsic material. In some embodiments, one or more of the layers included in multilayer stack 308 may include grading (e.g., increasing and/or decreasing) the content of one or more materials in the layer. Further, in some embodiments, one or more of the layers included in multilayer stack 308 may have a multilayer structure including at least two material layers, depending on the end use or target application. Numerous different material and layer configurations for multilayer stack 308 will be apparent in light of this disclosure.

Figure 3B:
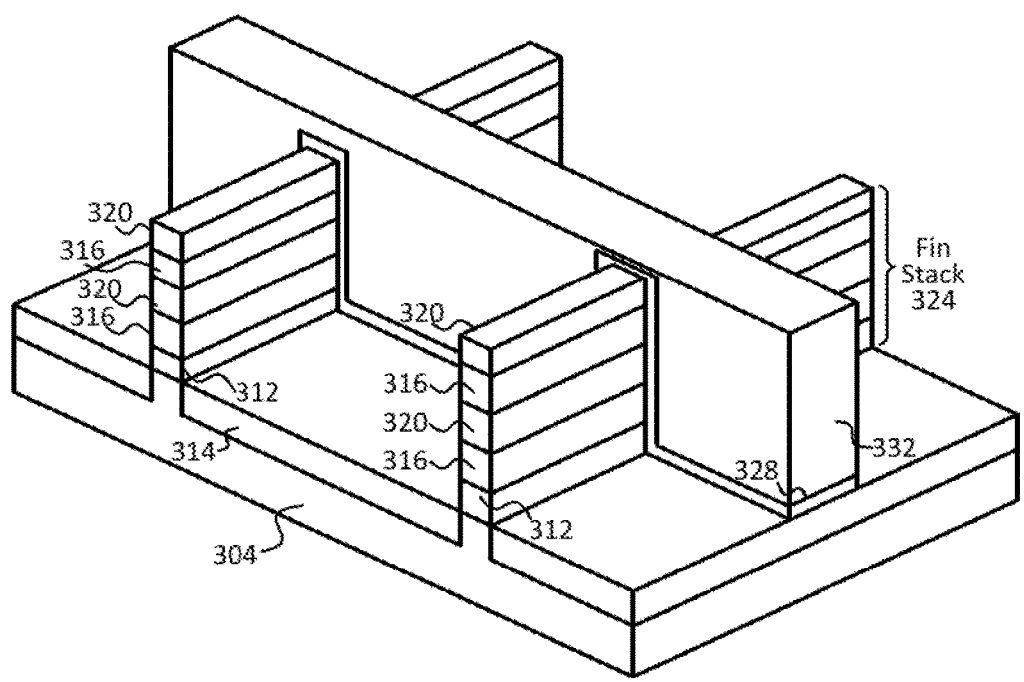

FIG. 3B illustrates an example resulting IC structure after the multilayer stack 308 in the structure of FIG. 3A is formed 212 into one or more fins, in accordance with an embodiment. As shown in this example embodiment, the stack 308 shown in FIG. 3A is formed into two fin-shaped stacks 324. In some embodiments, any suitable processing may be used to form fins stacks 324, such as patterning (using lithography and etching) stack 308 into the fin stacks 324 shown, for example. Such a patterning process may be similar to a shallow trench recess (STR) process that is employed to form 212 finned (e.g., tri-gate or FinFET) transistors. Any number of lithography and etch processes may to pattern the fin stacks 324, in accordance with some embodiments. Although only two fin stacks 324 are shown in FIG. 3B for ease of illustration, the IC structure may include any number of fin stacks formed from multilayer stack 308, such as 1-100, hundreds, thousands, millions, or more, as the devices to be formed can be on the nanotechnology scale, as can be understood based on this disclosure. As shown in FIG. 3B, the left and right fin stacks 324 include similar heights (dimension in the Z-axis direction) and widths (dimension in the X-axis direction). However, the present disclosure is not intended to be so limited. For instance, in some embodiments, the fin stacks 324 (when there are multiple fin stacks included) may be formed to have varying heights and/or varying widths. As is also shown in FIG. 3B, the structure includes optional shallow trench isolation (STI) layer 314, which may be formed using any suitable techniques. In some embodiments, layer 314 may be deposited between the fin stacks 324 and then recessed, and in some such embodiments, STI layer 314 may be level with at least a portion of the bottom sacrificial layer 312, for example, as opposed to being level with native portions of substrate 304, for instance. However, in some embodiments (e.g., embodiments where substrate 304 is an XOI substrate), STI layer 314 may be absent, as can be understood based on this disclosure. In still other embodiments, the portion of the substrate 304 directly under the fin stacks 324 can be removed via etching so that the STI layer 314 extends under the fin stacks 324 so that an additional insulation layer is disposed between the substrate 304 and the stacks 324. This preceding example is not limited to nanowire devices, but rather can be applied to FinFET configurations in which the fin is fabricated from a source region material, a drain region material, and a semiconductor body material (comprising a channel region) therebetween.

In some embodiments, fin stacks 324 may be formed using other suitable processing. For instance, in an example embodiment, the fins may be formed by forming fins in substrate 304 (fins native to the substrate), forming STI material between the native fins (and optionally under the native fins), removing at least a portion of the native fins to form fin trenches, and depositing the multilayer stack 324 in the fin trenches, and recessing (or removing) the STI material (e.g., to form fin stacks as shown in FIG. 3B). In such an example embodiment, STI material may be present between the fin stacks (and/or under the fin stacks) and such STI material may include any suitable dielectric, oxide (e.g., silicon dioxide), nitride (e.g., silicon nitride), and or other electrically insulating material, for example. Regardless of the processing used to form fin stacks 324, in some embodiments, STI material may be present between two such fin stacks 324 to provide electrical isolation therebetween, for example. Note that although the fin stacks 324 are shown as generally having a rectangular shape with 90 degree angles, such a shape is used for ease of illustration and the present disclosure is not intended to be so limited.

FIG. 3B also illustrates an example resulting IC structure after a dummy gate electrode 332 and dummy gate oxide 328 (collectively "gate stack") is formed 216 on the stacks 324, in accordance with an embodiment. In this example embodiment, dummy gate dielectric layer 328 and dummy gate electrode 332 include sacrificial material (e.g., dummy polysilicon for the gate electrode 332) to be later removed and replaced in a replacement gate process. The dummy gate dielectric layer 328 can be a layer that protects the region under the gate stack from etches applied to the semiconductor device in subsequent processes. Such a gate last process flow is utilized in this example embodiment to allow for processing of the channel region into one or more nanowires when the channel region(s) (i.e., the portion of the fin stacks 324 covered by the dummy gate stack) is (are) exposed after removal of the dummy gate stack and prior to the formation of the final gate stack, and also allow for replacement of the first sacrificial layer 312 with a low-k dielectric material, as will be apparent in light of this disclosure. In some embodiments, formation of the dummy gate stack may be performed using any suitable techniques, such as depositing the dummy gate dielectric layer 328 and dummy gate electrode layer 332 (also referred to simply as dummy gate), and patterning the dummy layers 328 and 332 into a dummy gate stack.

There are two alternative flows within the method 200 by which the first sacrificial layer 312 can be removed and replaced with a low-k dielectric material, in some embodiments. These two alternative flows are referred to as first flow 200' and second flow 200", both of which are described below in turn.

In the first flow 200', the first sacrificial layer 312 is removed 218 while leaving the second sacrificial layers 316 and non-sacrificial layers 320. As described above, this can be accomplished by formulating the first sacrificial layer 312 so that it is etched faster than the second sacrificial layers 316. Even portions of the first sacrificial layer 312 below the dummy gate stack can be removed because the etch techniques used to remove the first sacrificial layer 312 are anisotropic (i.e., non-directional). That is, portions of the first sacrificial layer 312 can be removed by the action of the anisotropic etchant at exposed ends of the first sacrificial layer 312 even when portions of the first sacrificial layer are under the dummy gate stack.

Figure 3C:
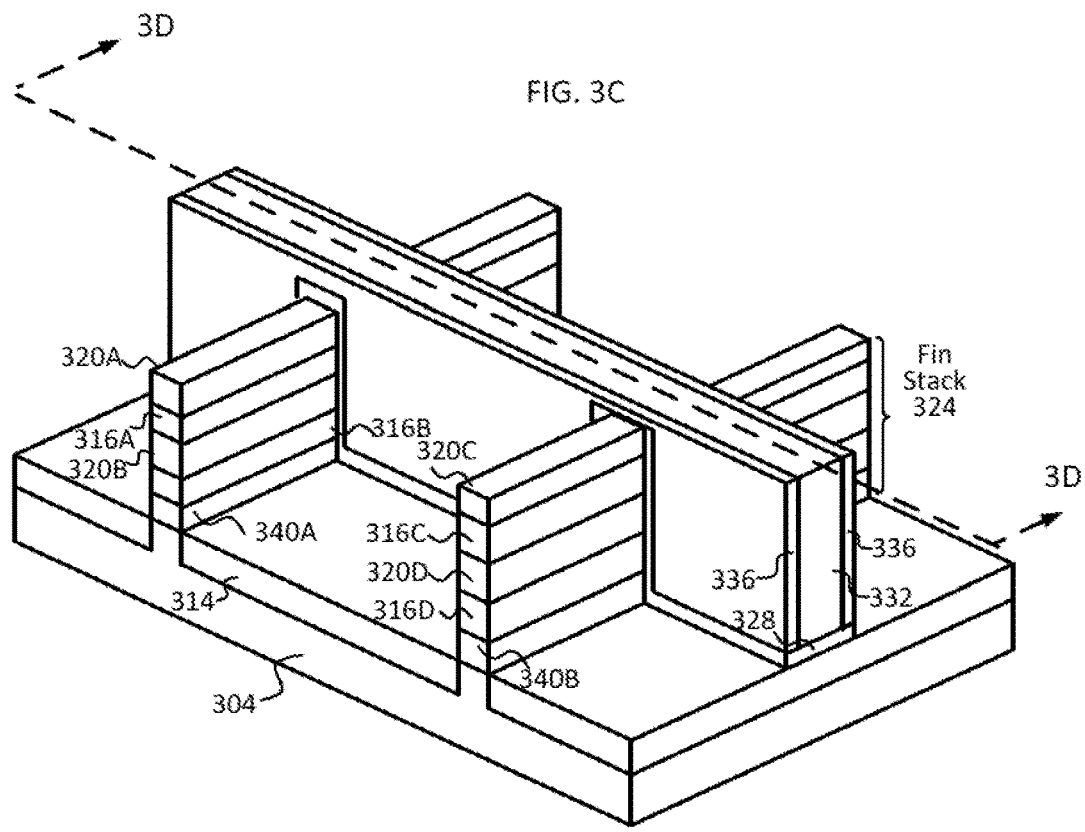
Figure 3D:
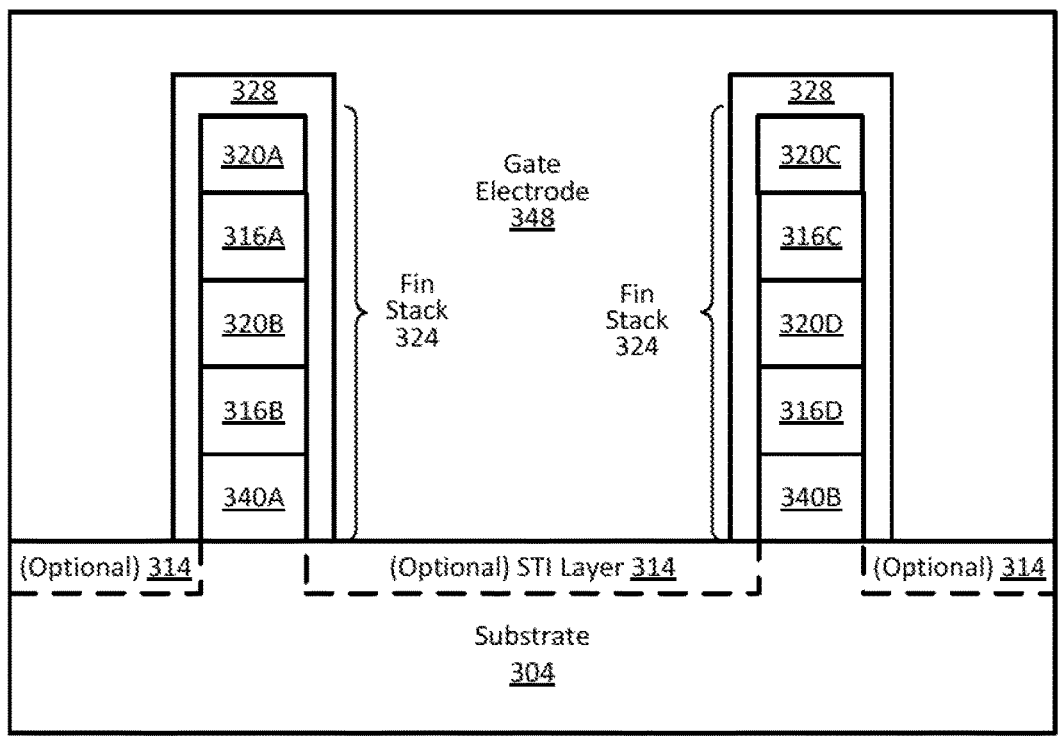

As shown in FIGS. 3C and 3D, a low-k dielectric material layer 340A, 340B is then formed 226 in the vacancies between the substrate 304 and an adjacent second sacrificial layer 316B, 316D formed by selective removal 218 of the first sacrificial layer 312. In this example, formation 226 of the layer 340A, 340B can occur during the formation 222 of gate spacers 336 on the dummy gate electrode 332. In this example, the same material is used for both the gate spacers 336 and the layers 340A, 340B. Examples of materials used for the low-k dielectric material layer 340A, 340B and the gate spacers 336 include Si3N4, any of silicon oxide nitrides (SiOxNy), and SiO2, among other materials. The formation 226 of the low-k dielectric material layer 340A, 340B prevents parasitic leakage from the nanowires 320B, 320D into the substrate 304, as described above. In some embodiments, the low-k dielectric material layers 340A, 340B can be a continuous layer extending from the substrate 304 (and/or an optional STI layer 314) to the second sacrificial layer 316 and between a source region and a drain region.

In some examples, the selective removal 218 of the first sacrificial layer, and selective removal 234 of the second sacrificial layer can occur simultaneously (e.g., if the two layers have the same composition). In this case, the low-k layer 340 is formed 226 in areas previously occupied by both of the first sacrificial layer 312 and the second sacrificial layer 316. Those regions previously corresponding to the second sacrificial layer 316 can then be isotropically etched to remove the low-k material and the formed vacancies then replaced with high-k dielectric material and gate electrode, as described below.

As can be understood, the non-sacrificial layers 320 become the nanowires 320' after sacrificial layers 312, 316 are removed via selective etch processing. Recall that any number of nanowires may be formed in the channel region of a GAA transistor, in accordance with some embodiments. Therefore, although only two nanowires 320' are formed in the exposed channel region in the figures described herein, the selective etch processing may be used to form 1-10, or more nanowires within an single channel region, for example. In some embodiments, the selective etch processing may not completely remove the sacrificial portion of the multilayer fin stack 324, such that at least a portion of one or more sacrificial layers 312, 316 may still be present in the end structure, for example. Therefore, in some such embodiments, the selective etch processing may be considered to at least partially remove the sacrificial portion of the multilayer fin stack 324, for example. Also note that although the nanowires 320' are depicted as generally having a rectangular shape in the cross-sectional and perspective views herein, the present disclosure is not intended to be so limited. For example, in some embodiments, included nanowires may have different cross-sectional geometries, which may more-so resemble a circle, semi-circle, ellipse, semi-ellipse, oval, semi-oval, square, parallelogram, rhombus, trapezoid, diamond, triangle, pentagon, hexagon, and so forth, regardless of orientation. Further, two nanowires included in the same transistor channel region need not have similar cross-sectional geometry, in some embodiments.

In some embodiments, the nanowires 320' formed via the selective etch processing in the channel region (i.e., the area between source and drain regions) may retain their original thickness (dimension in the Z-axis direction). However, in other embodiments, some material may be removed from layers 320'during the selective etch processing. Therefore, in some embodiments, the resulting nanowires 320'may include a maximum thickness (dimension in the Z-axis or vertical direction) in the range of 1-100 nm (e.g., 2-10 nm), or any other suitable maximum thickness as will be apparent in light of this disclosure. Further, in some embodiments, the nanowires 320' within the channel region of a transistor may include nanowires of varying maximum thicknesses, such that two nanowires may have different relative thicknesses (e.g., relative maximum thickness difference of at least 1, 2, 3, 4, 5, or 10 nm). However, in other embodiments, the nanowires within the channel region of a transistor may include nanowires of similar maximum thicknesses, such that each nanowire is within 1, 2, or 3 nm of the average maximum thickness of all of the nanowires in the channel region, or within some other suitable amount as will be apparent in light of this disclosure. The space/distance between nanowires included in a transistor channel region may also vary, in accordance with some embodiments. In some embodiments, the minimum distance between two nanowires in a channel region (e.g., the dimension indicated as distance D in FIG. 3E and FIG. 3H) may be in the range of 1-50 nm (e.g., 2-10 nm) or some other suitable amount as will be apparent in light of this disclosure. In some embodiments, the minimum distance between two nanowires may be less than a quantity in the range of 2-10 nm, or less than some other suitable maximum threshold amount as will be apparent in light of this disclosure. In some embodiments, the minimum distance (e.g., distance D) that can be achieved between two nanowires formed using the techniques herein employing carbon as variously described may be relatively less compared to techniques of forming similar nanowires without employing carbon. Therefore, as a result of being able to achieve smaller minimum distances (e.g., due to the lack of or reduced diffusion between sacrificial and non-sacrificial layers), more nanowires can be formed in a given channel region height, thereby leading to an improvement in transistor performance, as described herein.

Figure 3E:
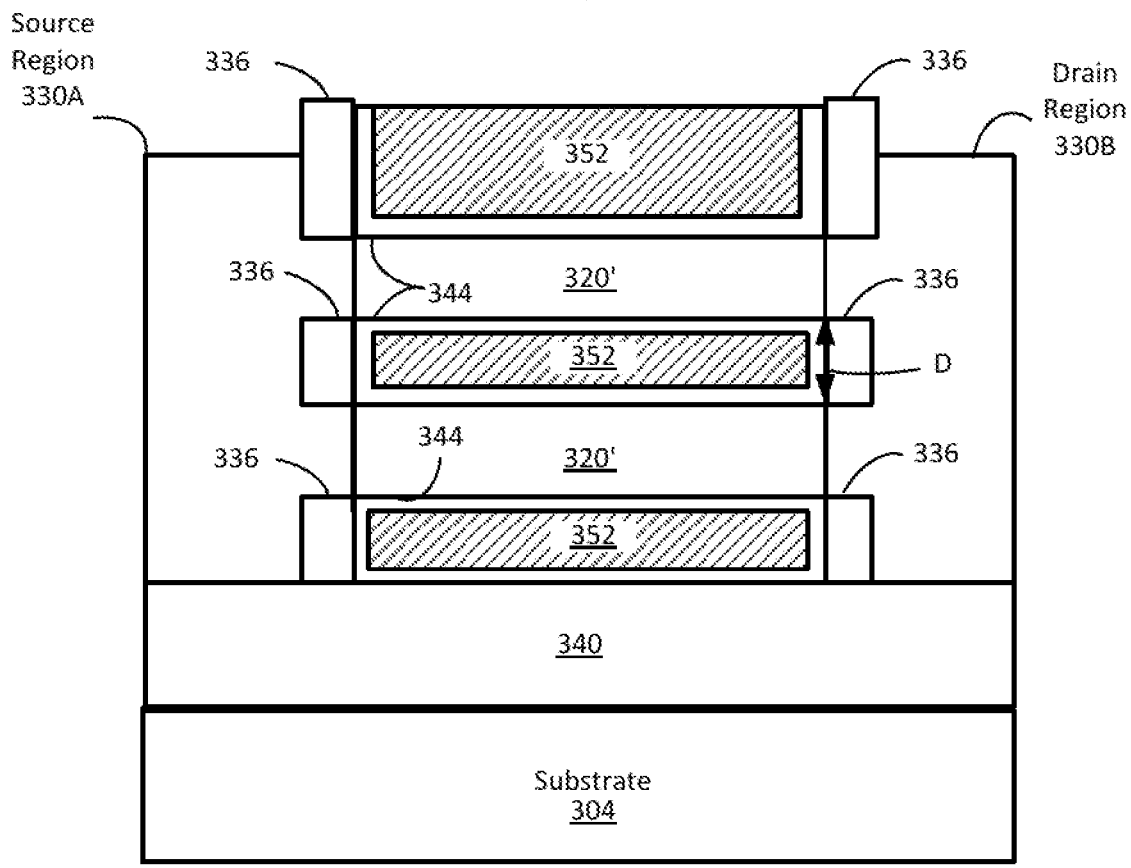

Source regions and drain regions can be formed 230 on the low-k dielectric layer 340. Source and drain regions can be formed 230 in one of two ways. In one way, the exposed portions of the fin stacks 324 (i.e., not covered by the gate stack), such as those shown in FIG. 3C, can be removed and replaced with replacement material. An example of this is illustrated in FIG. 3E and shown as source and drain regions 330A and 330B. Alternatively, the non-sacrificial layers 320 of the fin stacks 324 can be used as nanowire S/D regions. In some examples, such as the one shown in FIG. 3E, portions of spacer 336 are etched to expose the nanowires 320' therebetween while leaving other portions of the spacers 336 to prevent electrical contact between the source/drain regions and gate electrode 352. The source regions and drain regions can be formed so as to extend through the gaps in the spacer 336 to make electrical contact with the nanowires 320'. These can be colloquially referred to as "tips" or "tip regions" of the source/drain regions.

Regardless of the S/D scheme employed, the S/D regions may include any suitable material, such as group IV semiconductor material, for example. Further, the S/D regions may include any suitable doping scheme compatible with the material selections described below, such that one or both of the S/D regions in a given S/D set may include suitable n-type and/or p-type impurity dopants, depending on the desired configuration. For instance, in the case of fabricating an NMOS device, both of the S/D regions in a given set may include suitable n-type dopants, and in the case of fabricating a PMOS device, both of the S/D regions in a given set may include suitable p-type dopants, in accordance with some embodiments. Recall that in TFET devices, the S/D regions in a given set are generally oppositely type doped, such that one of the S/D regions is n-type doped and the other is p-type doped. In some embodiments, one or both of the S/D regions in a given set may include a multilayer structure of two or more material layers, for example. In some embodiments, one or both of the S/D regions in a given set may include grading (e.g., increasing and/or decreasing) the content/concentration of one or more materials in at least a portion of the region(s). In some embodiments, additional layers may be included in the S/D regions, such as a cap layer used to reduce resistance reduction between the S/D regions and the S/D contacts, for example. Such a cap/resistance reducing layer may include different material than the main S/D material and/or include higher concentration of doping relative to the main S/D material, in accordance with some such embodiments. Note that in some embodiments, S/D processing may be performed after the final gate stack processing has been performed.

Note that the rectangular block shape of S/D regions, whether the exposed portions fin stacks 324 and/or S/D regions 330A, 330B in FIG. 3E, are used for ease of illustration; however, such regrown S/D regions may include other shapes and sizes, as can be understood based on this disclosure.

The second sacrificial layers 316A, 316B, 316C, and 316D can be removed 234, thus leaving surfaces of the non-sacrificial layers 320A, 320B, 320C, 320D exposed. As described above, the second sacrificial layers 316A-316D can be removed by, for example, extending a duration of an etch used to remove the first sacrificial layers 312A, 312B. Once removed, a high-k dielectric layer 344 can be conformally formed on the exposed surfaces of the exposed surfaces of the nanowires 320A, 320B, 320C, 320D. As will be understood in light of the present disclosure, the high-k dielectric layer 344 shown in FIG. 3E functions as the gate oxide layer. In some examples, the high-k dielectric layer 344 is a bi-layer structure having a high-k dielectric material 360 (e.g., hafnium oxide) in contact with another dielectric material having a dielectric constant that is lower than the dielectric constant of the high-k dielectric material. The other dielectric material (e.g., silicon dioxide) can be in contact with the gate electrode material. As described elsewhere herein, examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used. Further, the gate electrode 352 may comprise a wide range of suitable metals or metal alloys, such as aluminum, tungsten, titanium, tantalum, copper, titanium nitride, or tantalum nitride, for example.

The dummy gate oxide 328 and dummy gate electrode 332 can be removed 238 using patterning techniques and chemistries, thus forming a gate electrode trench defined by the top most and exposed portion of spacers 336 shown in FIG. 3E. As also shown in FIG. 3E, the gate electrode 352 can be formed 242 between nanowires 320' and in the gate electrode trench between the top layer of spacer 336 portions using any of the materials and processes described above, including the ability to "self-align" the gate electrode 352 formation between these top spacers 336. The formation of the spacers 336, so as be in contact with opposite ends of the gate electrode portions 352 while leaving opposing ends of the nanowires 320' exposed is described below in the context of flow 200" and FIGS. 3F, 3F', 3F", and 3F'".

The gate electrode 352 structure may include a central metal plug portion (e.g., tungsten) with one or more outer work function layers and/or barrier layers (e.g., tantalum, tantalum nitride), and/or a resistance reducing cap layer (e.g., copper, gold). In some embodiments, the gate dielectric (whether formed from the layer 344 or multiple layers of dielectric material) and/or gate electrode 352 may include grading (increasing or decreasing, as the case may be) of the concentration of one or more materials therein. Numerous different gate structure configurations can be used, as will be apparent in light of this disclosure.

In some embodiments, gate dielectric layer(s) 344 may be formed using any suitable techniques, such as using any suitable deposition process (e.g., MBE, CVD, ALD, PVD), for example. In some embodiments, the layer(s) 344 may be relatively thin, such as having a thickness in the range of 1-20 nm, for example, or some other suitable thickness as will be apparent in light of this disclosure.

FIG. 3E (and FIG. 3H) illustrates an example resulting IC structure after the gate (or gate electrode) 352 has been deposited, in accordance with an embodiment. In some embodiments, gate electrode 352 may be formed using any suitable techniques, such as using any suitable deposition process (e.g., MBE, CVD, ALD, PVD), for example. In some embodiments, the gate electrode 352 may include a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate electrode 352 may have a thickness in the range of 10-200 nm, for example, or some other suitable thickness as will be apparent in light of this disclosure.

As shown in the example embodiments depicted in the figures, gate electrode 352 (and the entire gate stack, in general) wraps completely or 100 percent around each nanowire 320'. However, in some embodiments, the gate electrode 352 may substantially wrap around each nanowire, such that it wraps around at least 60, 65, 70, 75, 80, 85, 90, 95, or 98 percent of each nanowire, for example, or some other suitable amount as will be apparent in light of this disclosure. As can also be understood based on this disclosure, in some embodiments, the layers 344 may wrap around more of one or more nanowires 320' in the channel region. In some examples, because of the conformal nature of the layer 344, the gate electrode 352 may not wrap entirely and/or continuously around some or all of the nanowires 320' because the space between nanowires 320' is blocked by the layers 344, thus preventing gate electrode 352 from forming in the space between nanowires 320', particularly when that space (having a minimum dimension D, shown in FIG. 3E) is relatively small (e.g., less than 5 nm).

The second flow 200" is an alternative flow by which it fabricate some embodiments of the present disclosure and, in large part, relies on the same processes performed in a different order than those of the first flow 200'. Reference to FIGS. 2, 3F, 3G, and 3H will facilitate explanation.

Figure 3F:
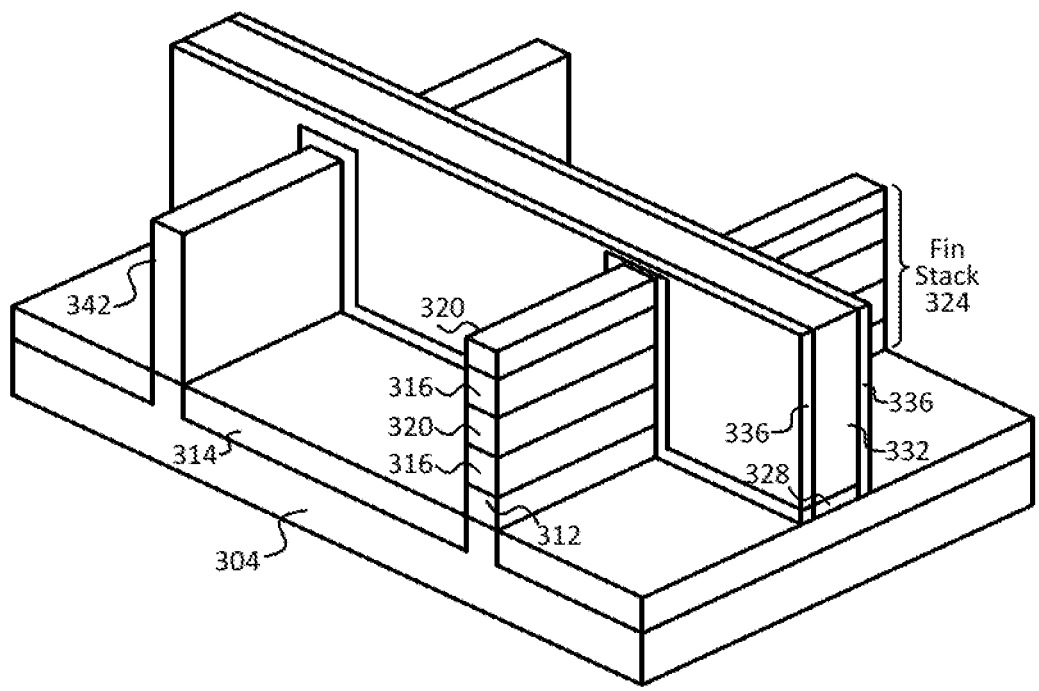
Figure 3F:
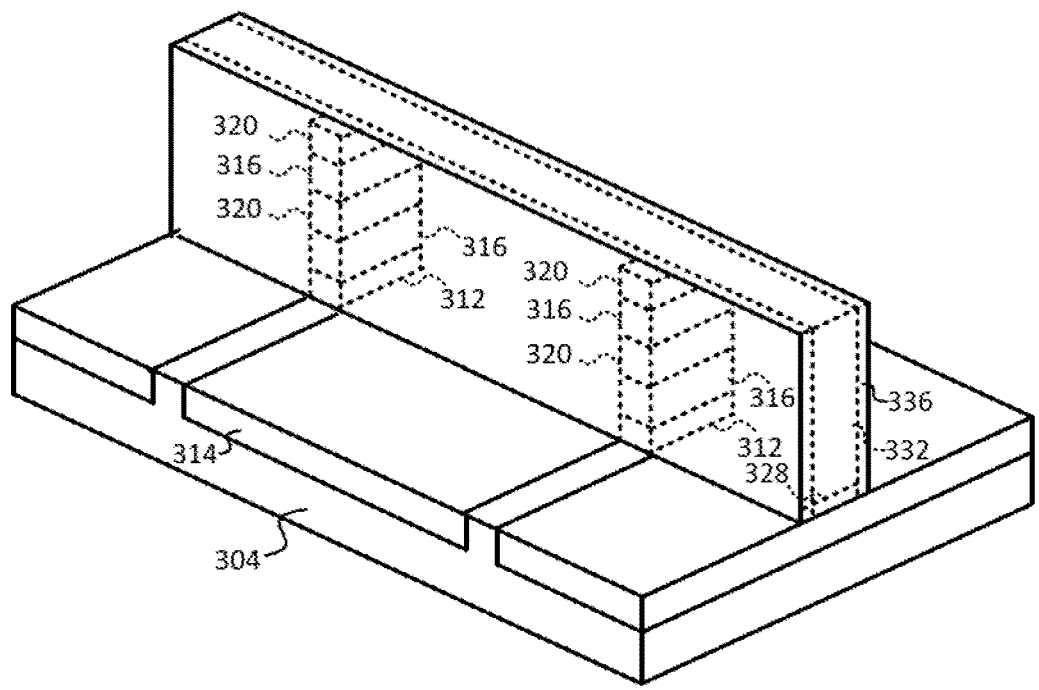
Figure 3F:
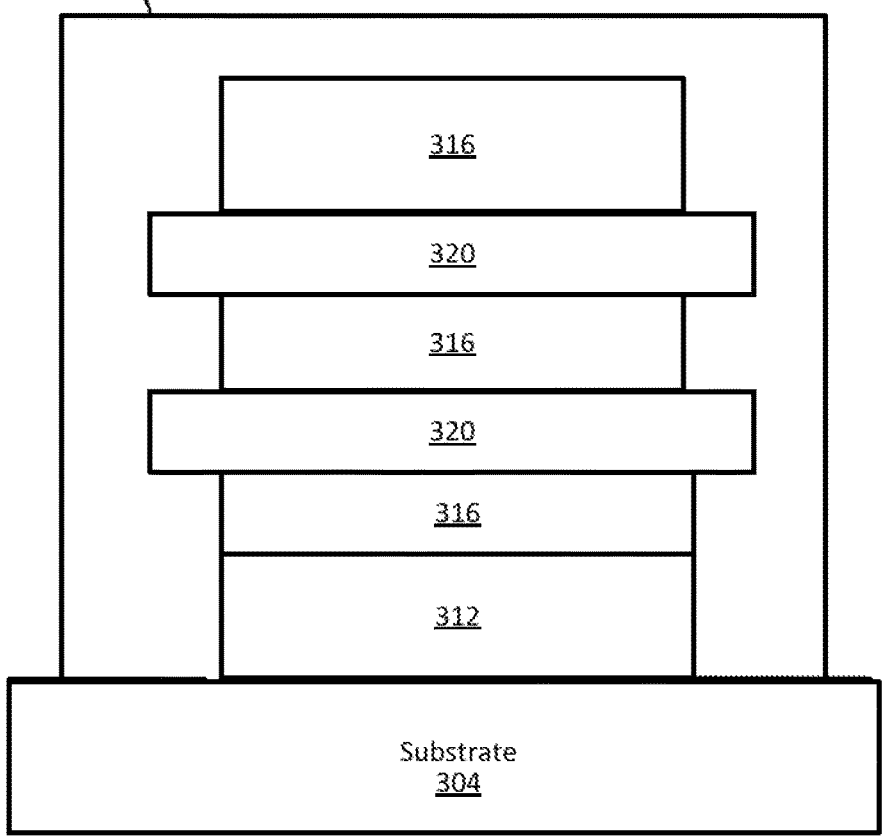

The second flow 200" continues the method 200 after formation 216 of the dummy gate oxide and dummy gate electrode by forming gate spacers 220 (e.g. depositing spacer material and performing a spacer etch) to form spacers 336 on either side of the dummy gate stack, as shown in FIG. 3F. Spacers 336 (also referred to as gate spacers or sidewall spacers) can help determine the channel length and can also help with "self-aligned" replacement gate processes, for example. As can be understood based on this disclosure, the dummy gate stack (and spacers 336) helps to define the channel region and source/drain (S/D) regions of each fin stack 324, where the nanowires comprising a semiconductor body (and comprising one or more channel regions) are below the dummy gate stack, and the S/D regions are adjacent to and on either side of the channel region. As described above, the spacers 336 may include any suitable material, such as any suitable electrical insulator, dielectric, oxide (e.g., silicon oxide), and/or nitride (e.g., silicon nitride) material, as will be apparent in light of this disclosure. In some embodiments, a hardmask may be formed on dummy gate 332 and/or on spacers 336, which may be included to protect those features during subsequent processing, for example. The spacer formation 220 can begin by removing the fin portions corresponding to source/drain regions (shown as either or both of fin 342 or fin stack 324 in FIG. 3F) not covered by the dummy gate stack and then conformally forming 220 spacer material on all exposed surfaces. This is shown in FIG. 3F'. In some embodiments, prior to forming 220 the spacer material, the second sacrificial layers 316 is selectively etched so as to indent the exposed surfaces of the sacrificial layers 316 relative to the exposed surfaces of the layers 320. Because the formation 220 of the spacer is conformal, these indentations are filled with spacer 336 material. This shown in a cross-section perpendicular to the gate in FIG. 3F". The spacer material can be anisotropically etched, exposing ends of the layers 320 while leaving spacer material to cover the recessed ends of the layers 312 and 316. In some embodiments, layers 316 can be further etched so as to be partially recessed from the spacer 336, as shown in FIG. 3F'".

Figure 3G:
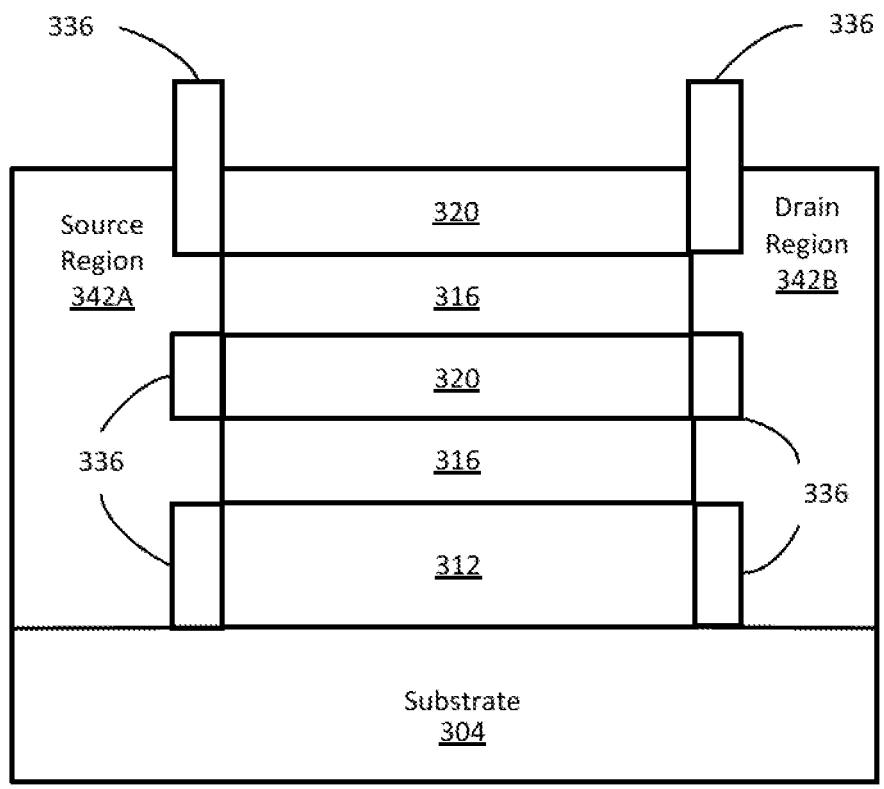
Figure 3H:
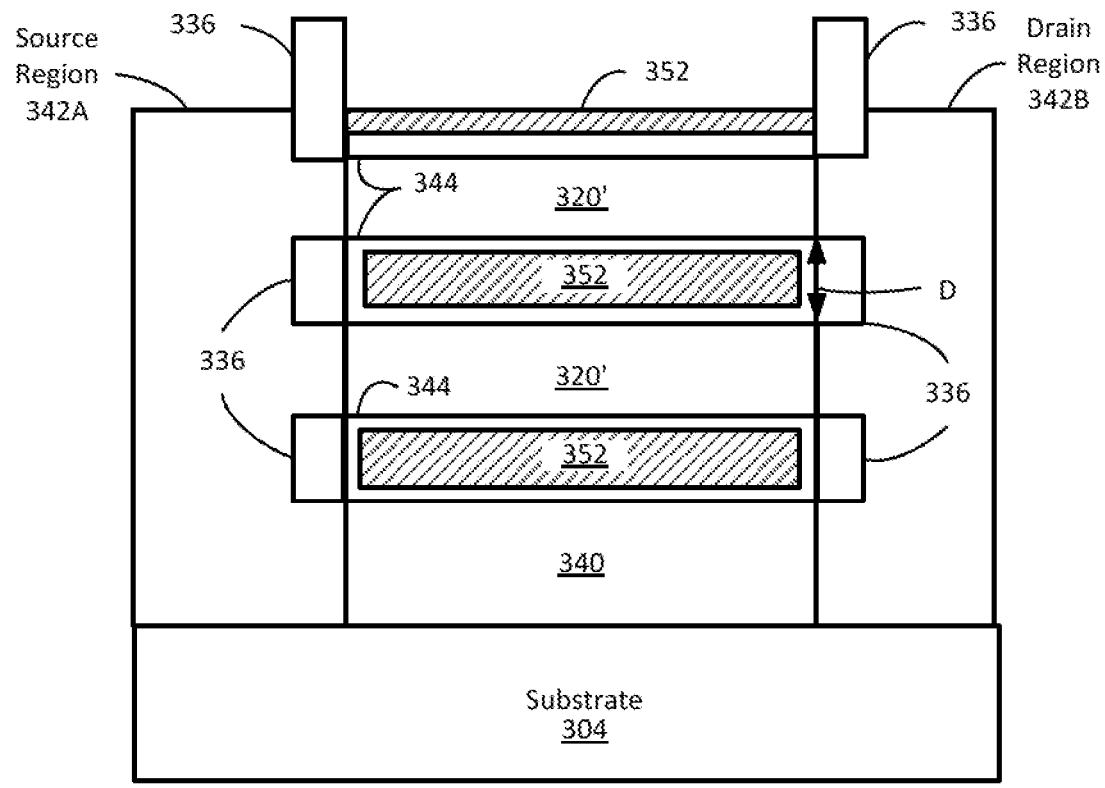

Turning to FIG. 3G, source and drain regions 342A, 342B can then be formed 224 using any of the materials and techniques described above. For convenience of illustration, the schematic depictions of the structures formed in the second flow 200" assume monolithic source and drain regions 342A, 342B rather than nanowire configurations of source and drain regions.

The second flow 200" continues with removal 228 of the dummy gate oxide and dummy gate electrode, thus exposing the portion of the first sacrificial layer 312, the second sacrificial layer 316, and the nanowires 320 between the source region and drain region. This is shown in FIG. 3G, which is a cross-sectional view taken perpendicular to the S/D regions and gate spacers 336.

Thus exposed, the portion of the first sacrificial layer 312 between the source region 342A and the drain region 342B is removed 232 and replaced with a low-k dielectric material 340, as described above in the context of the flow 200'. Similarly, after replacement 232 of the first sacrificial layer with a low-k dielectric material 340, the second sacrificial layer is removed 236 and a conformal layer of high-k dielectric material 348 is formed 236 on exposed surfaces. Again, the processes and materials for this removal and formation 232 have been previously described above in the context of the flow 200' and need no further explanation. Final gate electrode 352 and gate oxide layers 348 are then formed 240. An illustration of this structure appears in FIG. 3H.

The flows 200' and 200" both then finish by completing 244 IC processing. This can include forming a layer of interlayer dielectric (ILD) material on the structures of FIGS. 3E and 3H, in accordance with embodiments. In some embodiments, the ILD layer may be formed using any suitable techniques, such as depositing the ILD material and optionally performing a polish/planarization process In some embodiments, the ILD layer may include a dielectric material, such as silicon dioxide or silicon nitride, or some other suitable electrically insulating material, for example. Completing 244 IC processing can include formation of S/D contacts, in accordance with an embodiment. In some embodiments, S/D contacts may be formed using any suitable techniques, such as forming contact trenches in the ILD layer encapsulating the IC structure. These trenches can be formed over the respective S/D regions. Metal or metal alloy (or other suitable electrically conductive material) can be deposited in the trenches. In some embodiments, S/D contact formation may include silicidation, germinidation, and/or annealing processes, for example. In some embodiments, S/D contacts may include aluminum or tungsten, although any suitable conductive metal or alloy can be used, such as silver, nickel-platinum, or nickel-aluminum, for example. In some embodiments, one or more of the S/D contacts may include a resistance reducing metal and a contact plug metal, or just a contact plug, for instance. Example contact resistance reducing metals include, for instance, nickel, aluminum, titanium, gold, gold-germanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact regions, such as adhesion layers (e.g., titanium nitride) and/or liner or barrier layers (e.g., tantalum nitride), if so desired.

Additional processing to complete 244 the IC after S/D contact processing may include back-end or back-end-of-line (BEOL) processing to form one or more metallization layers and/or to interconnect the transistor devices formed, for example. Any other suitable processing may be performed, as will be apparent in light of this disclosure. Note that the techniques and resulting IC structures formed therefrom are presented in a particular order for ease of description. However, one or more of the processes may be performed in a different order or may not be performed at all. Recall that the techniques may be used to form one or more transistor devices including any of the following: field-effect transistors (FETs), metal-oxide-semiconductor FETs (MOSFETs), tunnel-FETs (TFETs), and/or nanowire (or nanoribbon or gate-all-around (GAA)) configuration transistors (having any number of nanowires/nanoribbons). In addition, the devices formed may include p-type transistor devices (e.g., PMOS) and/or n-type transistor devices (e.g., NMOS). Further, the transistor-based devices may include complementary MOS (CMOS) devices or quantum devices (few to single electron), to name a few examples. Numerous variations and configurations will be apparent in light of this disclosure.

Materials that are compositionally different as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such compositional diversity, the materials may also have distinct dopants (e.g., gallium and magnesium) or the same dopants but at differing concentrations. In still other embodiments, compositionally different may further refer to two materials that have different crystallographic orientations. For instance, (110) silicon is different from (100) silicon. Creating a stack of different orientations could be accomplished, for instance, with blanket wafer layer transfer.

Example System

Figure 4:
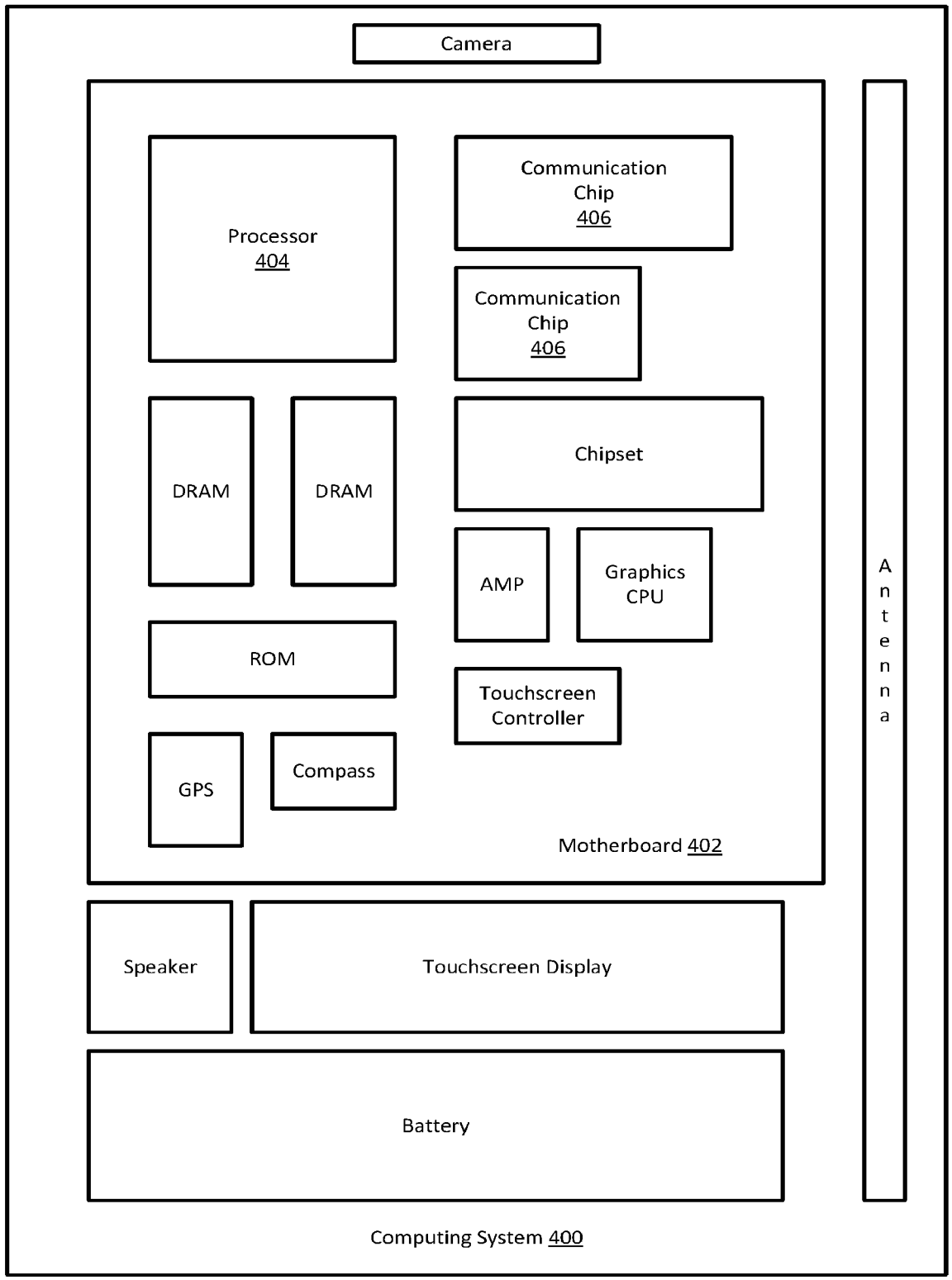
FIG. 4 illustrates a computing system implemented with integrated circuit structures and/or transistor devices formed using the techniques disclosed herein, in accordance with some embodiments of the present disclosure.

FIG. 4 is an example computing system implemented with one or more of the integrated circuit structures as disclosed herein, in accordance with some embodiments of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400, etc.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment of the present disclosure. In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others. In some embodiments, communication chip 406 may include one or more transistor structures having a gate stack an access region polarization layer as variously described herein.

The processor 404 of the computing system 400 includes an integrated circuit die packaged within the processor 404. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit device comprising: a body over a substrate, the body comprising a first semiconductor material; a first dielectric layer between the substrate and the body, the first dielectric layer comprising a first dielectric material having a first dielectric constant; a second dielectric layer between the first dielectric layer and the body, the second dielectric layer also around the body, the second dielectric layer comprising a second dielectric material having a dielectric constant greater than the first dielectric constant; a gate electrode around the body and in contact with the second dielectric layer; and a source region and a drain region comprising a second semiconductor material having a different chemical composition from the first semiconductor material, the source region and the drain region on opposing sides of the body.

Example 2 includes the subject matter of Example 1, wherein the first dielectric layer is between the substrate and a bottom surface of both the source region and the drain region.

Example 3 includes the subject matter of Example 1 or 2, wherein first portions of the source region and the drain region are in direct contact with the substrate, and the first dielectric layer is on the substrate between second portions of the source region and the drain region.

Example 4 includes the subject matter of any of the preceding Examples, wherein the body comprises a first body and a second body over the first body.

Example 5 includes the subject matter of Example 4, further comprising an additional dielectric layer on and around the second body, the additional dielectric layer comprising the second dielectric material.

Example 6 includes the subject matter of Example 5, further comprising a portion of the gate electrode between the additional dielectric layer on the second body and the second dielectric layer on the first body.

Example 7 includes the subject matter of any of the preceding Examples, wherein the first dielectric material comprises silicon and at least one of oxygen and nitrogen.

Example 8 includes the subject matter of any of the preceding Examples, wherein the second dielectric material comprises hafnium and oxygen.

Example 9 includes the subject matter of any of the preceding Examples, further comprising first and second gate spacers, wherein the first gate spacer is between the second dielectric material and one of the source region or drain region, and the second gate spacer is between the second dielectric material and the other of the source region or drain region.

Example 10 includes the subject matter of Example 9, wherein the gate spacers comprise the first dielectric layer.

Example 11 includes the subject matter of Example 9, wherein the first and second gate spacers each includes multiple portions that are discontinuous from one another.

Example 12 includes the subject matter of any of the preceding Examples, wherein the source region and the drain region comprise at least one source region nanowire and at least one drain region nanowire, respectively.

Example 13 includes the subject matter of any of the preceding Examples, wherein the body comprises one of a nanowire or a nanoribbon.

Example 14 is a computing device comprising the integrated circuit device that includes the subject matter of any of the preceding Examples, Example 15 is a method for forming a gate all around semiconductor device comprising: forming a first sacrificial layer of a first material on a substrate; forming a second sacrificial layer on the first sacrificial layer, the second sacrificial layer formed from a second material having a different chemical composition from the first material; forming a first semiconductor layer on the second sacrificial layer; forming a dummy gate structure over the first sacrificial layer, the second sacrificial layer, and the first semiconductor layer; selectively removing the first sacrificial layer while leaving the second sacrificial layer and the first semiconductor layer, the removing forming a first gap defined between the substrate and the second sacrificial layer; forming a first dielectric layer of a first dielectric material in the first gap; selectively removing the second sacrificial layer to form a second gap defined by the first dielectric layer and the first semiconductor layer; and forming a second dielectric layer of a second dielectric material on a surface of the first semiconductor layer exposed by the second gap.

Example 16 includes the subject matter of Example 15, wherein the first dielectric material has a first dielectric constant and the second dielectric material has a second dielectric constant greater than the first dielectric constant.

Example 17 includes the subject matter of either of Example 15 or Example 16, wherein forming the first sacrificial layer, the second sacrificial layer, and the first semiconductor layer comprises epitaxial forming.

Example 18 includes the subject matter of any of Examples 15 to 17, wherein the first dielectric material prevents leakage current between the first semiconductor layer and the substrate.

Example 19 includes the subject matter of any of examples 15 to 18, further comprising: removing the dummy gate structure; and forming a gate electrode around the first semiconductor layer.

Example 20 includes the subject matter of any of Examples 15 to 19, further comprising: forming gate spacers on the dummy gate structure after selectively removing the first sacrificial layer; and forming the first dielectric material in the first gap during formation of the gate spacers, wherein the gate spacers and the first dielectric layer are both formed from a first dielectric material having a first dielectric constant.

What is claimed is:
1. An integrated circuit device comprising:
 a nanowire over a substrate, the nanowire comprising a first semiconductor material;
 a first dielectric layer between the substrate and the nanowire, the first dielectric layer comprising a first dielectric material having a first dielectric constant, and the first dielectric layer having an uppermost surface;
 a second dielectric layer completely surrounding a channel region of the nanowire, the second dielectric layer comprising a second dielectric material having a dielectric constant greater than the first dielectric constant, a portion of the second dielectric layer in contact with the first dielectric layer;
 a gate electrode completely surrounding the channel region of the nanowire and in contact with the second dielectric layer;
 a source region and a drain region comprising a second semiconductor material, the source region and the drain region on opposing sides of the nanowire, and the source region and the drain region having a bottommost surface below the uppermost surface of the first dielectric layer; and first and second gate spacers, wherein the first gate spacer is between the second dielectric material and one of the source region or drain region, and the second gate spacer is between the second dielectric material and the other of the source region or drain region.

2. The integrated circuit device of claim 1, wherein the first dielectric layer is between the substrate and a bottom surface of both the source region and the drain region.

3. The integrated circuit device of claim 1, wherein first portions of the source region and the drain region are in direct contact with the substrate, and the first dielectric layer is on the substrate between second portions of the source region and the drain region.

4. The integrated circuit device of claim 1, further comprising a second nanowire over the nanowire.

5. The integrated circuit device of claim 4, further comprising an additional dielectric layer on and around the second nanowire, the additional dielectric layer comprising the second dielectric material.

6. The integrated circuit device of claim 5, further comprising a portion of the gate electrode between the additional dielectric layer on the second nanowire and the second dielectric layer on the nanowire.

7. The integrated circuit device of claim 1, wherein the first dielectric material comprises silicon and at least one of oxygen and nitrogen.

8. The integrated circuit device of claim 1, wherein the second dielectric material comprises hafnium and oxygen.

9. The integrated circuit device of claim 1, wherein the first and second gate spacers each includes multiple portions that are discontinuous from one another.

10. The integrated circuit device of claim 1, wherein the source region and the drain region comprise at least one source region nanowire and at least one drain region nanowire, respectively.

11. A computing device, comprising:
a board; and
a component coupled to the board, the component including an integrated circuit structure, comprising:
a nanowire over a substrate, the nanowire comprising a first semiconductor material;
a first dielectric layer between the substrate and the nanowire, the first dielectric layer comprising a first dielectric material having a first dielectric constant, and the first dielectric layer having an uppermost surface;
a second dielectric layer completely surrounding a channel region of the nanowire, the second dielectric layer comprising a second dielectric material having a dielectric constant greater than the first dielectric constant, a portion of the second dielectric layer in contact with the first dielectric layer;
a gate electrode completely surrounding the channel region of the nanowire and in contact with the second dielectric layer;
a source region and a drain region comprising a second semiconductor material, the source region and the drain region on opposing sides of the nanowire, and the source region and the drain region having a bottommost surface below the uppermost surface of the first dielectric layer; and
first and second gate spacers, wherein the first gate spacer is between the second dielectric material and one of the source region or drain region, and the second gate spacer is between the second dielectric material and the other of the source region or drain region.

12. The computing device of claim 11, further comprising:
a memory coupled to the board.

13. The computing device of claim 11, further comprising:
a communication chip coupled to the board.

14. The computing device of claim 11, wherein the component is a packaged integrated circuit die.

15. The computing device of claim 11, wherein the component is selected from the group consisting of a processor, a communications chip, and a digital signal processor.

16. The computing device of claim 11, wherein the first dielectric layer is between the substrate and a bottom surface of both the source region and the drain region.

17. The computing device of claim 11, wherein first portions of the source region and the drain region are in direct contact with the substrate, and the first dielectric layer is on the substrate between second portions of the source region and the drain region.

18. The computing device of claim 11, further comprising a second nanowire over the nanowire.

19. The computing device of claim 18, further comprising an additional dielectric layer on and around the second nanowire, the additional dielectric layer comprising the second dielectric material.

20. The computing device of claim 19, further comprising a portion of the gate electrode between the additional dielectric layer on the second nanowire and the second dielectric layer on the nanowire.

21. An integrated circuit device comprising:
a nanowire over a substrate, the nanowire comprising a first semiconductor material;
a first dielectric layer between the substrate and the nanowire, the first dielectric layer comprising a first dielectric material having a first dielectric constant, and the first dielectric layer having an uppermost surface;
a second dielectric layer completely surrounding a channel region of the nanowire, the second dielectric layer comprising a second dielectric material having a dielectric constant greater than the first dielectric constant, a portion of the second dielectric layer in contact with the first dielectric layer;
a gate electrode completely surrounding the channel region of the nanowire and in contact with the second dielectric layer;
a source region and a drain region comprising a second semiconductor material, the source region and the drain region on opposing sides of the nanowire, wherein first portions of the source region and the drain region are in direct contact with the substrate, and the first dielectric layer is on the substrate between second portions of the source region and the drain region; and
first and second gate spacers, wherein the first gate spacer is between the second dielectric material and one of the source region or drain region, and the second gate spacer is between the second dielectric material and the other of the source region or drain region.

22. An integrated circuit device comprising:
a nanowire over a substrate, the nanowire comprising a first semiconductor material;
a first dielectric layer between the substrate and the nanowire, the first dielectric layer comprising a first dielectric material having a first dielectric constant, and the first dielectric layer having an uppermost surface;

a second dielectric layer completely surrounding a channel region of the nanowire, the second dielectric layer comprising a second dielectric material having a dielectric constant greater than the first dielectric constant, a portion of the second dielectric layer in contact with the first dielectric layer;

a gate electrode completely surrounding the channel region of the nanowire and in contact with the second dielectric layer;

a source region and a drain region comprising a second semiconductor material, the source region and the drain region on opposing sides of the nanowire; and first and second gate spacers, wherein the first gate spacer is between the second dielectric material and one of the source region or drain region, and the second gate spacer is between the second dielectric material and the other of the source region or drain region, wherein the first and second gate spacers each includes multiple portions that are discontinuous from one another.

\* \* \* \* \*